(12) United States Patent
Reinholz et al.

(10) Patent No.: US 10,244,656 B2
(45) Date of Patent: Mar. 26, 2019

(54) HEATING DEVICE FOR A VEHICLE, AND METHOD OF COOLING AN ELECTRONIC CONTROL UNIT OF THE HEATING DEVICE

(71) Applicants:Uwe Reinholz, Stahnsdorf (DE); Florian Larisch, Zankenhausen (DE); Karl Goettl, Rosenheim (DE); Michael Staake, Munich (DE); Stephan Buckl, Munich (DE); Nils Elm, Gilching (DE); Thorsten Kabelitz, Munich (DE)

(72) Inventors: Uwe Reinholz, Stahnsdorf (DE); Florian Larisch, Zankenhausen (DE); Karl Goettl, Rosenheim (DE); Michael Staake, Munich (DE); Stephan Buckl, Munich (DE); Nils Elm, Gilching (DE); Thorsten Kabelitz, Munich (DE)

(73) Assignee: Webasto SE, Stockdorf (DE)

( * ) Notice: Subject to any disclaimer, the term of this patent is extended or adjusted under 35 U.S.C. 154(b) by 683 days.

(21) Appl. No.: 14/398,186

(22) PCT Filed: Apr. 29, 2013

(86) PCT No.: PCT/EP2013/058918
§ 371 (c)(1),
(2) Date: Oct. 31, 2014

(87) PCT Pub. No.: WO2013/164313
PCT Pub. Date: Nov. 7, 2013

(65) Prior Publication Data
US 2015/0117847 A1 Apr. 30, 2015

(30) Foreign Application Priority Data
May 2, 2012 (DE) .......................... 10 2012 207 301

(51) Int. Cl.
*B60H 1/22* (2006.01)
*F24H 1/10* (2006.01)
(Continued)

(52) U.S. Cl.
CPC ........... *H05K 7/2039* (2013.01); *F24H 1/142* (2013.01); *F24H 9/0015* (2013.01); *F24H 9/1818* (2013.01); *F24D 2200/29* (2013.01)

(58) Field of Classification Search
CPC ........... B60H 1/2221; H05B 2203/023; H05B 2203/02; F24H 3/085; F24H 1/121; F24H 3/0429; F24H 1/009
(Continued)

(56) References Cited

U.S. PATENT DOCUMENTS 5,995,711 A * 11/1999 Fukuoka ............ B60H 1/00328
219/202
7,200,327 B2 * 4/2007 Pierron ................ B60H 1/2225
165/148
(Continued)

FOREIGN PATENT DOCUMENTS

CN 1194364 A 9/1998
CN 2650016 Y 10/2004
(Continued)

OTHER PUBLICATIONS

International Search Report dated Jul. 1, 2013 in connection with PCT/EP2013/058918.

*Primary Examiner* — Dana Ross
*Assistant Examiner* — Lawrence Samuels
(74) *Attorney, Agent, or Firm* — Quarles & Brady LLP

(57) ABSTRACT

The invention relates to a heating device (10) for a vehicle, comprising: a flow path (14, 16, 20, 22, 24) for a liquid heat transfer agent; an electric heating device (34) for generating heat and for releasing generated heat to the heat transfer
(Continued)

agent on a heating portion (20) of the flow path; and an electronic controller (26) for controlling a heat output of the heating device. The controller (26) is provided with a heat releasing body in order to release waste heat of the controller (26) to the heat transfer agent on a preheating portion (16) of the flow path upstream of the heating portion (20). The invention likewise relates to a method for cooling the controller.

11 Claims, 6 Drawing Sheets

(51) Int. Cl.
    *H05B 1/02*     (2006.01)
    *H05K 7/20*     (2006.01)
    *F24H 1/14*     (2006.01)
    *F24H 9/00*     (2006.01)
    *F24H 9/18*     (2006.01)

(58) Field of Classification Search
    USPC ......... 219/202, 505, 504; 392/465, 485, 479
    See application file for complete search history.

(56) References Cited

U.S. PATENT DOCUMENTS

| | | | |
|---|---|---|---|
| 8,395,097 B2* | 3/2013 | Bohlender | F24H 3/0405 219/202 |
| 9,234,677 B2* | 1/2016 | Clade | F24H 3/0405 |
| 2002/0011484 A1* | 1/2002 | Beetz | B60H 1/2218 219/530 |
| 2004/0084431 A1* | 5/2004 | Uhl | B60H 1/2225 219/201 |
| 2004/0112884 A1* | 6/2004 | Uhl | B60H 1/034 219/202 |
| 2008/0053981 A1* | 3/2008 | Adachi | H05B 3/50 219/202 |
| 2009/0020515 A1* | 1/2009 | Clade | F24H 3/0405 219/202 |
| 2011/0180617 A1* | 7/2011 | Saito | B60H 1/2221 236/49.3 |
| 2012/0087642 A1* | 4/2012 | Bohlender | H05B 3/24 392/465 |
| 2012/0193339 A1* | 8/2012 | Adachi | B60H 1/2221 219/202 |
| 2012/0237192 A1* | 9/2012 | Kominami | F28D 1/03 392/480 |
| 2013/0026151 A1* | 1/2013 | Adachi | B60H 1/2221 219/202 |
| 2013/0192796 A1* | 8/2013 | Kominami | F28D 1/00 165/104.19 |
| 2013/0243411 A1* | 9/2013 | Kominami | H05B 3/22 392/482 |
| 2014/0027444 A1* | 1/2014 | Kohl | B60H 1/2221 219/629 |
| 2014/0050465 A1* | 2/2014 | Kominami | B60H 1/2221 392/482 |

FOREIGN PATENT DOCUMENTS

| | | |
|---|---|---|
| CN | 1663826 A | 9/2005 |
| CN | 103380015 A | 10/2013 |
| DE | 10049030 A1 | 4/2002 |
| JP | 2004217023 A | 8/2004 |
| JP | 2008056044 A | 3/2008 |
| JP | 2010284045 A | 12/2010 |
| JP | 2011016489 A | 1/2011 |
| WO | 99/40375 A1 | 8/1999 |
| WO | 2011/129201 A1 | 10/2011 |

\* cited by examiner

HEATING DEVICE FOR A VEHICLE, AND METHOD OF COOLING AN ELECTRONIC CONTROL UNIT OF THE HEATING DEVICE

CROSS-REFERENCE TO RELATED APPLICATIONS

This application represents the national stage entry of PCT International Application No. PCT/EP2013/058918 filed Apr 29, 2013, which claims the benefit of German Patent Application 10 2012 207 301.9 filed May 2, 2012, both of which are hereby incorporated herein by reference for all purposes.

The invention relates to a heating device for a vehicle and to a method of cooling an electronic control unit of a heating device in a vehicle.

Electric heating devices are used, for example, in motor vehicles as an auxiliary heating or park heating. An electric heating device usually comprises at least one electric heating unit for generating heat and for discharging generated heat to a heat transport medium. The heat transport medium may for example be water or another suitable heat transport liquid. The electric heating unit may be connected to an electronic control unit that allows controlling the heating power of the heating unit. The electronic control unit may for instance be a power transistor or a semiconductor-based electronic circuit, e.g., for controlling an electrical current in the heating unit or for controlling a voltage applied at the heating unit.

As a side effect, the electronic control unit typically generates heat which must be discharged to prevent overheating of the control unit. For example, an air cooling that allows exhausting the waste heat via admitted air may be provided. The electronic control unit may for instance be placed inside an air duct through which air can flow. A blower, for example a fan, may be arranged within the duct in order to generate a flow of air. The air preheated by the electronic control unit can be routed further to the heating units in order to heat them further to the desired temperature. The heated air can then be further routed to its destination location, for example a passenger compartment of a vehicle.

It is an object of the invention to provide a compact, robust, energy-saving and constructionally simple electric heating device. Furthermore, it is an object of the invention to describe an energy-efficient method for cooling an electric control unit of a heating device which can be implemented in a constructionally simple manner.

These objects are achieved by the features of the independent claims. The dependent claims describe improvements and advantageous embodiments.

A heating device for a vehicle is described below, wherein the heating device comprises a flow path for a liquid heat transport medium, an electric heating unit for generating heat and for transferring generated heat to the heat transport medium on a heating section of the flow path, and comprising an electronic control unit for controlling a heating power of the heating unit. Furthermore, a method of cooling an electronic control unit of a heating device in a vehicle is described, wherein the heating device comprises: a flow path for a liquid heat transport medium; the electric heating unit, which is arranged to transfer heating heat to the heat transport medium on a heating section of the flow path; and the electronic control unit for controlling a heating power of the heating unit.

The control unit may be provided with a heat discharge body for discharging waste heat from the control unit to the heat transport medium on a preheating section of the flow path upstream of the heating section. The waste heat from the electronic control unit is therefore mainly not transferred directly to the target medium to be heated (for instance, air to be supplied to a passenger compartment of the vehicle) but to the liquid heat transport medium. The construction volume required for this may therefore be smaller, e.g., in comparison to an air cooling of the electronic control unit. An air duct or other components for defining an air flow path within the heating device and a blower may be dispensed with. The heat discharge body may for instance be arranged in an inlet chamber for the heat transfer medium or in any other flow area of the heat transport medium upstream of the heating section. A suitable dimensioning and a suitable geometrical shape of the heat discharge body in conjunction with a suitable flow velocity of the heat transport medium make it possible to assure a sufficient transfer of heat from the electronic control unit via the heat discharge body to the heat transport medium. The heat transport medium, for example, water, which flows past the heat discharge body, may thus be prevented from boiling. Boiling of the heat transport medium at the heat discharge body may be undesired as it may lead to the formation of bubbles at the heat discharge body, which may have a thermally isolating effect and may thus impede the flow of waste heat from the electronic control unit. However, the heat discharge body may be dimensioned and shaped such that even when the heat transport medium boils, bubbles produced at the heat discharge body are washed away with the flow of the heat transport medium. The heat discharge body having a smooth (not rough) and a stream-lined surface may therefore be advantageous. While a rough, uneven and not streamlined surface may be advantageous in that turbulence of the heat transport medium is generated, which is favorable for the flow of heat from the heat discharge body into the heat transport medium, the turbulence may, in a case in which the heat transport medium is boiling, have the effect that emerging bubbles remain stuck at the heat discharge body. However, if the risk of boiling is negligible, a design of the surface of the heat discharge body which stimulates turbulence may be the more favorable option.

The heating device may be equipped with an air heat exchanger for transferring heat from the heat transport medium downstream of the heating section to air. The air heat exchanger may for example comprise several channels for the heat transport medium and several channels for the air which are arranged proximate to each other to assure a good transfer of heat to the air.

The heating device may comprise a wall which defines the flow path in the preheating section at least partially, wherein the heat discharge body extends from the wall into the preheating section. The heat discharge body may for instance be formed as a protrusion of the wall or as a pin, bolt, or fin.

The heat discharge body may extend to an opposite part of the wall. The volume available in the preheating section can thus be used in an optimal manner. The heat discharge body may for example have two ends attached to opposite sides of the wall. This arrangement may be particularly robust. At each of the two ends an electronic control unit may be located if the heating device comprises several electronic control units. The heating device may for example comprise several electronic control units, for instance, several heating resistors connected in parallel, each of which having an electronic control unit, for instance, a power switch, associated with it.

The heat discharge body and the wall may be formed in a single piece. This may facilitate production of the heating device and assure robustness. The heat discharge body and the wall can for instance be made as a formed part of a suitable material having a high thermal conductivity. Alternatively, the heat discharge body may for instance be made of a material having a high thermal conductivity, for example a metal, e.g., aluminum, and the wall may be made of a material that is a good thermal insulator, for example, a plastic material or ceramics. The exchange of heat between the heat discharge body and the heat transport medium can thus be optimized while the loss of heat via the wall to proximate components or to another environment, e.g., air, of the heating device can be minimized.

As mentioned above, the heating device may comprise a second electronic control unit wherein the heat discharge body extends from the first control unit to the second control unit. The first control unit and the second control unit share a common heat discharge body in this case. Production costs may thus be lowered and robustness may be enhanced.

The heating device may further comprise a heat transfer unit for transferring heat from the heating unit to the heat transport medium in the heating section. Alternatively, the electric heating unit may be in direct contact with the heat transport medium.

The heat transfer unit and the heat discharge body may be formed in a single piece. For example, the component comprising the heat transfer unit and the heat discharge body may comprise a first group of fins and a second group of fins, wherein each group comprises at least one fin and the first group is arranged in the heating section of the flow path whereas the second group is arranged in the preheating section of the flow path. In other words, the first group of fins may be considered the heat transfer unit or a part of the heat transfer unit whereas the second group of fins may be considered the heat discharge body or a part of the heat discharge body. Proximate fins may for example define a channel for the heat transport medium which is part of the flow path.

The heating device may further comprise a connecting piece which connects the heat transfer unit and the heat discharge body to each other and which extends along a non-straight line so that the thermal resistance between the heat transfer unit and the heat discharge body is increased compared to a shortest line. The flow of heat from the electric heating unit to the electronic control unit can thus be minimized. The connecting piece may for example be formed as a corrugation or as several successive corrugations.

The mentioned non-straight line may for example have the shape of one of the following letters: L, U, V, S, Z, N, M, and W.

The heat discharge body may be oriented such that its flow resistance for the heat transport medium is minimum. The power required for moving the heat transport medium along the flow path, i.e., the power required for generating the flow of the heat transport medium, can thus be minimized. For example, if a pump is used to drive the heat transport medium, a pump having a comparatively low power and thus a relatively low consumption of energy may be used. Furthermore, the danger of formation of bubbles at the heat discharge body can thus be reduced.

As mentioned, the control unit may for example be a power transistor or comprise a power transistor as an essential element. The power transistor may be connected electrically in series with a heating resistor of the heating unit. The power switch may for example be a bipolar transistor with an isolated gate electrode (IGPT).

An isolation layer which is electrically isolating may be applied directly on the heat discharge body and a conduction layer which is electrically conductive may be applied directly on the isolation layer. The electrically conductive conduction layer is favorable to a fast dissipation of waste heat from the control unit. Furthermore, it can be used for an electrical contacting of the electronic control unit, e.g., for applying a control voltage. The isolation layer isolates the conduction layer electrically from the heat discharge body. This allows for making the heat discharge body fully or partially from an electrically conductive material, e.g., a metal.

The control unit may be attached on the electrically conductive conduction layer, via, for example, at least one solder ball, adhesive element, graphitic material, heat conduction foil, clamp connection, or screw connection. The mentioned attachment elements may be sufficiently flexible in view of thermal tensioning.

The method of cooling the electronic control unit of the heating device is distinguished from the prior art in that the control unit is provided with a heat discharge body which is placed on a preheating section of the flow path upstream of the heating section, wherein the heat transport medium flows past or around the heat discharge body, wherein waste heat from the control unit is discharged to the heat transport medium.

In the following description of the drawings, identical reference symbols refer to identical or comparable components.

Figure 1:
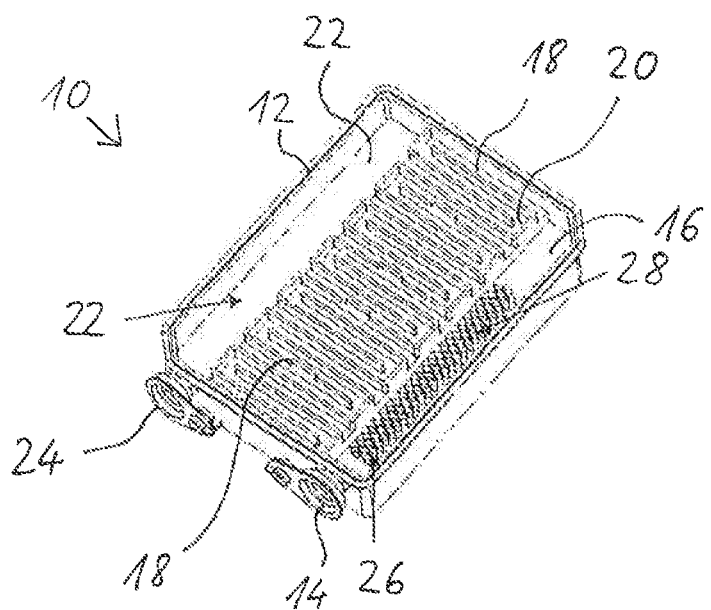
FIG. 1 shows a schematic perspective view of a heating device.
Figure 2:
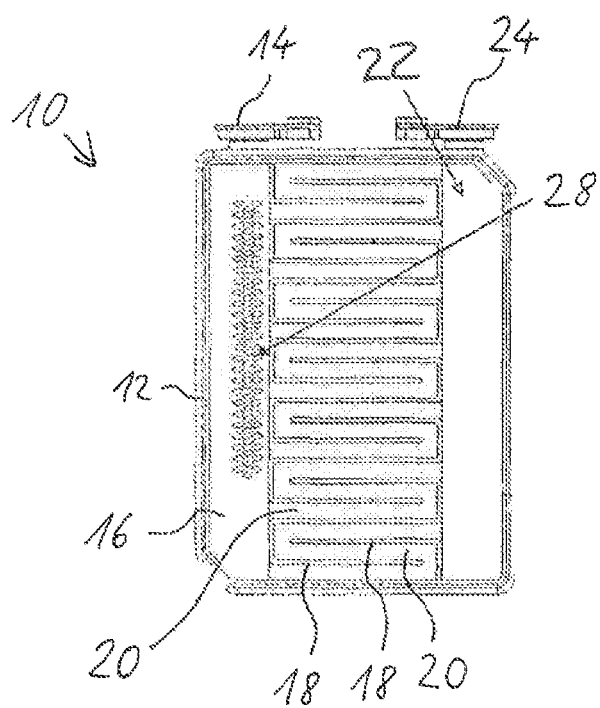
FIG. 2 shows a schematic top view of the heating device of FIG. 1.

FIGS. 1 and 2 show an electric heating device 10 for a vehicle, for example, for a motor vehicle or a mobile living or working container. The device 10 is represented as being open on its top side to reveal an inner area of the device 10. The heating device 10 comprises a housing 12. A flow path for a liquid heat transport medium, e.g., water, is defined inside the housing 12. In the shown example, the flow path comprises the following sections in this order: an inlet 14, an inlet chamber 16, several channels 20 defined by a heat transfer unit 18, an outlet chamber 22, and an outlet 24. The channels 20 are connected parallel to each other and connect the inlet chamber 16 to the outlet chamber 22.

At least one heating unit 34 (shown in FIGS. 4 and 5) is integrated in the heat transfer unit 18 or arranged on or under the heat transfer unit 18 and connected to the heat transfer unit 18 mechanically such that the thermal resistance between the heating unit 34 and the heat transfer unit 18 is as low as possible. In the shown example, the heating device 10 comprises a plurality of electric heating units 34 (shown in FIGS. 4 and 5) and a corresponding number of electronic control units 26 (also shown schematically in FIGS. 4 and 5) for controlling the individual heating power of each of the heating units 34. Each heating unit 34 thus has an electronic control unit 26 associated with it. The heating unit 34 may comprise one or more heating elements. The heating unit 34 and the control unit 26 may for example be a heating resistor and a power transistor connected in series with the heating resistor. Alternatively, a group of several heating units 34 may have a common control unit 26 associated with it. For instance, an embodiment may be envisioned in which the group comprises all heating units 34 of the heating device 10 and this group is connected in series with a power switch 26 to control the combined power of the heating units 34. If several control units 26 are provided, they may be implemented in a single component.

Each of the control units 26 is connected mechanically to a heat discharge body 28. The heat discharge body 28 serves to discharge waste heat from the electronic control unit 26 to the heat transport medium in the inlet chamber 16. The inlet chamber 16 is therefore also referred to as the preheating section of the flow path. Each control unit 26 may have one or more heat discharge bodies 28 associated with it. Alternatively, the heat discharge bodies 28 may be considered as a single larger heat discharge body. In the shown example, the heat discharge bodies 28 extend from the control units 26 into the inlet chamber 16 and, during operation of the heating device 10, the heat transport medium flows around them whereby heat from the heat discharge bodies is transferred to the heat transport medium. The heat discharge bodies 28 and thus the control units 26 are thereby cooled whereas the heat transport medium is preheated. The preheated heat transport medium flows from the inlet chamber 16 further through the channels 20. Thereby it flows past the heat transfer unit 18 which defines the channels 20 and absorbs heat generated by the heating units 34. Each of the channels 20, or the channels 20 collectively, are therefore also referred to as the heating section of the flow path. The thus heated heat transport medium then flows further through the outlet chamber 22 and leaves the heating device 10 through the outlet 24.

Each of the heat discharge bodies 28 may for example be designed as a fin having for example a rectangular or V-shaped cross section to discharge heat from the control unit, e.g., from the power semiconductor, into the heat transport medium. The heat discharge body 28 can therefore also serve for routing the heat transport medium. Alternatively, the heat discharge body 28 may for example be a cone, bolt, or pin for absorbing the heat under the respective control unit, e.g., under a relatively small chip area, at a respective point or spot. Such a cone, bolt, or pin can also enhance turbulence of the heat transport medium and thus enhance discharging of heat. Overheating of the electronic control unit can thus be avoided and the waste heat from the control unit is used for heating the heat transport medium.

Figure 3:
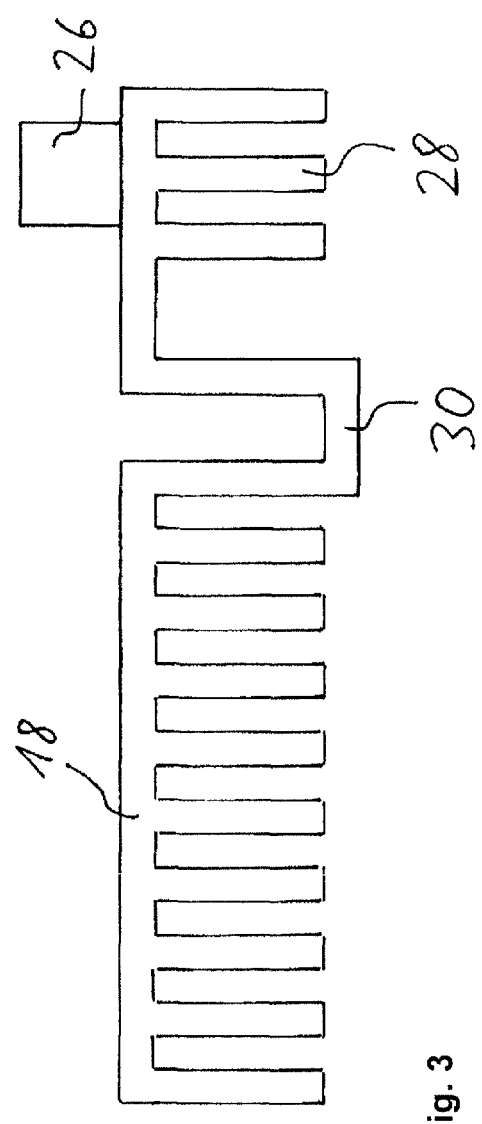
FIG. 3 shows a schematic side view of an electronic control unit, a heat discharge body, and a heat transfer unit.

FIG. 3 schematically shows a side view of an example of the heat transfer unit 18, the control unit 26, and the heat discharge body 28. In the shown example, the heat transfer unit 18 and the heat discharge body 28 each comprise a group consisting of several fins, which are also known as cooling fins and which serve for a fast transfer of heat to the heat transport medium on the heating section and on the preheating section of the flow path, respectively. The control unit 26, e.g., a semiconductor chip, may be attached to the heat discharge body 28. In the shown example, the heat transfer unit 18 and the heat discharge body 28 are formed in a single piece. They are connected to each other via a connecting piece 30, which extends along a non-straight line. Thus, a compromise between simple manufacturing and great robustness on the one hand and good thermal isolation between the heat transfer unit 18 and the heat discharge body 28 on the other hand is achieved. It is desirable for the heat discharge body 28 to be thermally isolated from the heat transfer unit 18 as well as possible, at least if the heating unit 34 (see FIGS. 4 and 5) which is in thermal contact with the heat transfer unit 18, is to reach a higher operating temperature than the control unit 26. In the example, the connecting piece 30 is substantially U-shaped. The connecting piece 30, when compared to a hypothetical straight connecting piece with the same distance of end points, has a greater length and thus a greater thermal resistance, whereby heating of the electronic control unit is reduced. The heat transfer unit 18 and the heat discharge body 28 are thus thermally decoupled from each other to a certain degree. In other words, given the same geometrical distance, which should be as small as possible, between the heat transfer unit 18 and the heat discharge body 28, the non-straight connecting piece 30 results in a lower flow of heat from the heating unit 34 to the control unit 26 in comparison to an equally envisionable straight connecting piece. This results in a compact construction in which the heat transfer unit 18 (heating heat transfer unit) and the heat transfer unit 28 (semiconductor heat transfer unit) may be implemented in a single component without too much heating the electronic control unit 26 by the heating unit 34.

Figure 4:
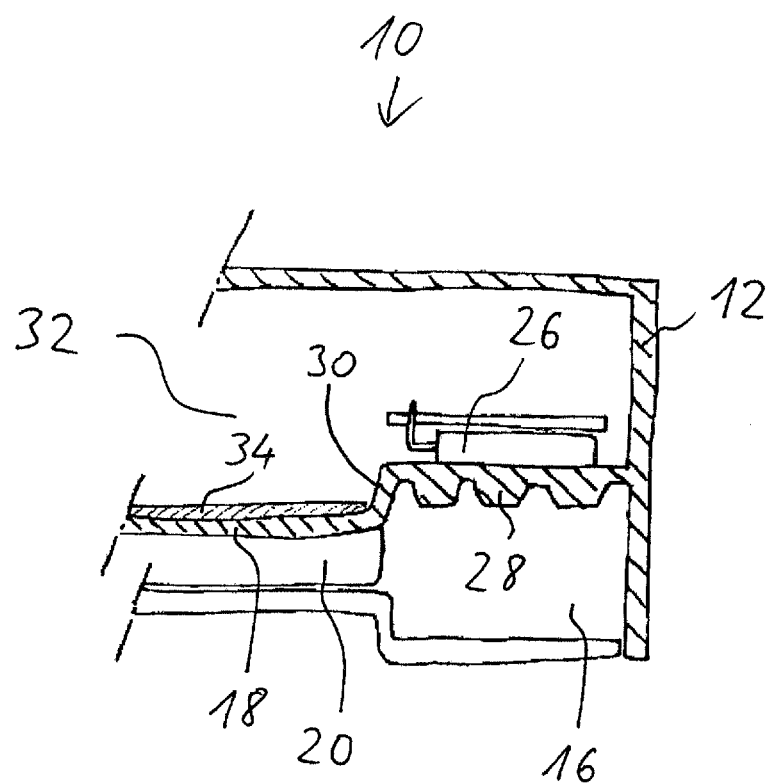
FIG. 4 shows a schematic sectional view of the heating device in accordance with a first variant.

FIG. 4 shows an embodiment of the heating device 10 in which the heat transfer unit 18 and the heat discharge body 28 are connected to each other via a straight connecting piece 30.

Figure 5:
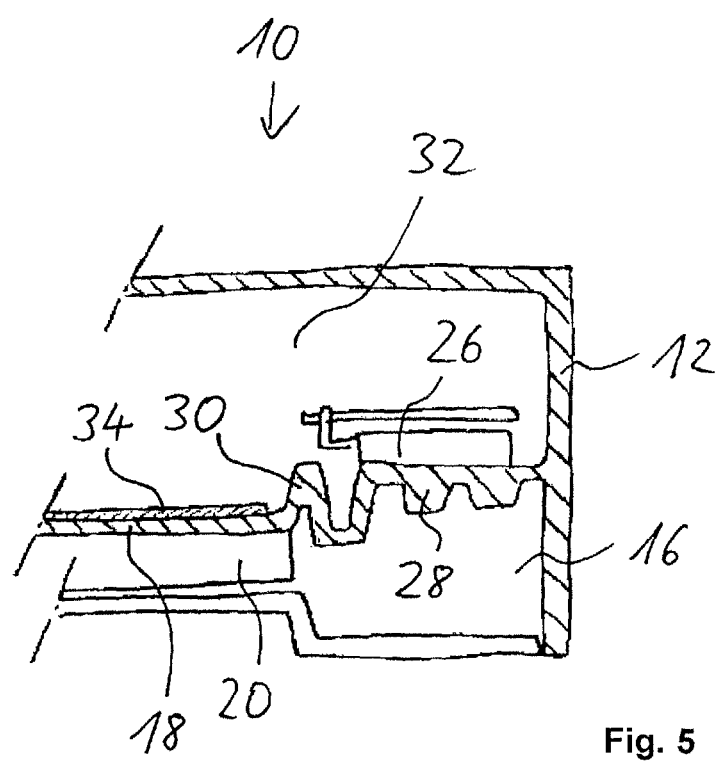
FIG. 5 shows a schematic sectional view of the heating device according to a second variant.

The embodiment schematically represented in FIG. 5 differs from the one in FIG. 4 only in that the connecting piece 30 is non-straight, e.g., S-shaped, to achieve a better thermal isolation between the heat transfer unit 18 and the heat discharge body 28 and thus between the heating unit 34 and the control unit 26, given the same total volume of the heating device 10.

Figure 6:
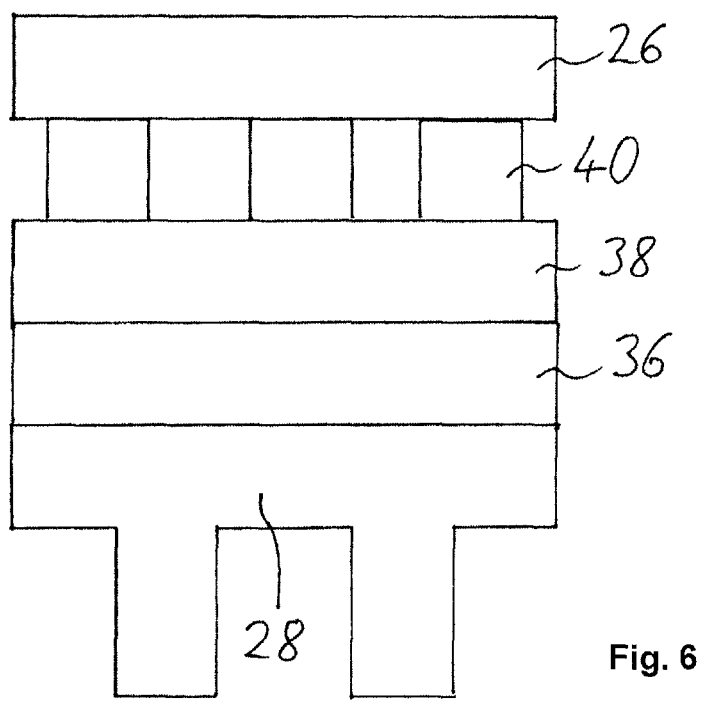
FIG. 6 shows a schematic sectional view of an electronic control unit having a heat discharge body.

In order to achieve a fast discharge of waste heat from the control unit 26 via the heat discharge body 28, it is proposed to place the control unit 26 in direct contact with the heat discharge body 28. FIG. 6 schematically shows an example of a possible way of connecting the electronic control unit 26 to the heat discharge body 28. An electrically isolating isolation layer 36 is directly coated or sprayed on the heat discharge body 28. The isolation layer 36 may for example be applied directly on the heat discharge body 28 using a thermal spraying technique. The material of the isolation layer may for example be a filled plastic material, glass, or ceramics, e.g., Al2O3. The electrically isolating isolation layer 36 should be a good thermal conductor.

An electrically conductive conduction layer is applied directly on the isolation layer 36. The conduction layer 38 can cause heat spreading and thus improve cooling of the control unit 26. The conduction layer may for example consist of a phase change material. The material of the conduction layer may for instance be copper. The conduction layer 38 can be applied onto the isolation layer 36 using thermal spraying or another coating technique. The conduction layer 38 can, in addition, be used to apply a supply or control voltage at the electronic control unit 26. In the shown example, the electronic control unit, e.g., provided as a chip, is solded on the conduction layer 38 via several (e.g., three) solder balls. Alternatively, the control unit 26 may be attached, for example, via a thermally conductive adhesive system, a graphitic material, a heat conduction foil, clamp or screw connections, or by a combination of these means. The layers 36 and 28 may each have a thickness of about 100 micrometers, for example.

Expensive multicoating systems and positioning techniques can thus be avoided. Material and costs may be reduced or optimized. The lean construction may also have a particularly small volume. The proposed construction is particularly suitable for an automated manufacturing process.

Figure 7:
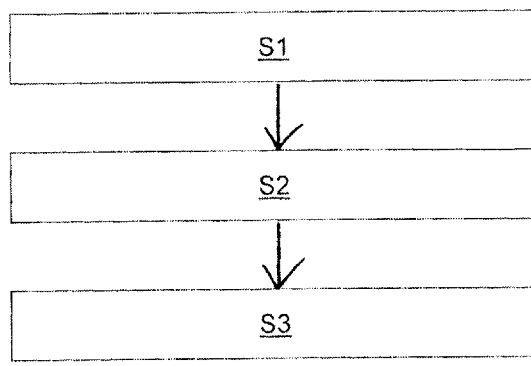
FIG. 7 shows a flow chart.

The flow chart in FIG. 7 illustrates an operating mode of the heating device 10 in which the electronic control unit 26 is cooled. In block S1, the heating device 10 is switched on. For example, a pump (not shown) may be switched on to move the heat transport medium along the flow path. At the same time or before or after this, the electronic control unit 26 may be actuated so as to drive an electrical current through the heating unit 34 to generate heat.

The electric heating unit 34 thus discharges heating heat to the heat transport medium in the heating section of the flow path (block S2). Before this, the heat transport medium which flows past and around the heat discharge body 28 absorbs waste heat from the control unit 26 via the heat discharge body 28, whereby the control unit 26 is cooled and the heat transport medium is preheated.

In block S3, the heating unit 10 is switched off.

The features of the invention disclosed in the preceding description, in the drawings, and in the claims may be relevant individually as well as in any combination for implementing the invention.

"Controlling" refers to changing a state in a controlled manner, for example, changing the value of a physical quantity in a controlled manner or influencing a component of a device in a controlled manner. "Regulating" refers to controlling using feedback, that is, changing a state in a controlled manner in dependence of the state itself. "Regulating" is therefore considered a particular kind of controlling. Any control operation mentioned in this patent application may be a control operation using feedback, i.e., a regulating operation. In particular, the control unit 26 may be a regulating unit.

LIST OF REFERENCE SYMBOLS 10 device
12 housing
14 inlet
16 inlet chamber
20 channels
22 outlet chamber
24 outlet
26 control unit
28 heat discharge body
30 connecting piece
34 heating unit
36 isolation layer
38 conduction layer
40 solder ball

The invention claimed is:

1. A heating device for a vehicle, comprising:
a flow path for a liquid heat transport medium;
an electric heating unit generating heat; and
a heat transfer unit discharging generated heat from the electric heating unit to the heat transport medium in a heating section of the flow path; and
a first electronic control unit controlling the electric heating unit, the control unit including a heat discharge body discharging waste heat from the control unit to the heat transport medium in a preheating section of the flow path upstream of the heating section, wherein the heat transfer unit and the heat discharge body are formed in a single-piece unitary construction, the single piece unitary construction including a non-linear thermal decoupling portion extending between the heat transfer unit and the heat discharge body and increasing the thermal resistance between the heat transfer unit—and the heat discharge body as compared to a straight line.

2. The heating device of claim 1, including an air heat exchanger discharging heat from the heat transport medium downstream of the heating section to air.

3. The heating device of claim 1, including a wall at least partially defining the flow path in the preheating section, wherein the heat discharge body extends from the wall into the preheating section.

4. The heating device of claim 3, wherein the heat discharge body-extends to an opposite part of the wall.

5. The heating device of claim 3, wherein the heat discharge body and the wall are a single piece.

6. The heating device of claim 1, including a second electronic control unit, wherein the heat discharge body of the first control unit extends to the second control unit.

7. The heating device of claim 1, wherein the non-straight line is shaped as an L, U, V, S, Z, N, M, or W.

8. The heating device of claim 1, wherein the control unit is a power transistor.

9. The heating device of claim 1, wherein an electrically isolating isolation layer is on the heat discharge body and an electrically conductive conduction layer is directly on the isolation layer, and wherein the control unit is on the conduction layer.

10. The heating device of claim 9, wherein the control unit is attached to the electrically conductive conduction layer via at least a solder ball, an adhesive element, a graphitic material, a conduction foil, a clamp connection, or a screw connection.

11. A method of cooling an electronic control unit of a heating device in a vehicle, wherein the heating device includes a flow path for a liquid heat transport medium, an electric heating unit discharging heating heat to the heat transport medium in a heating section of the flow path, and the electronic control unit controlling the heating unit, said method comprising:
discharging waste heat from the control unit to the heat transport medium, wherein the control unit is provided with a heat discharge body arranged on a preheating section of the flow path upstream of the heating section, and the heat transport medium flows past or around the heat discharge body to receive the waste heat discharged from the control unit, and a non-linear thermal decoupling portion extends along the flow path between the heat transfer unit and the heat discharge body, the non-linear thermal decoupling portion increasing the thermal resistance between the heat transfer unit—and the heat discharge body as compared to a straight line, wherein the non-linear thermal decoupling portion, the heat transfer unit and the heat discharge body are formed of a single unitary construction.

* * * * *